United States Patent [19]

Carlson et al.

[11] 4,117,506

[45] Sep. 26, 1978

[54] AMORPHOUS SILICON PHOTOVOLTAIC DEVICE HAVING AN INSULATING LAYER

[75] Inventors: David Emil Carlson, Yardley, Pa.; Christopher Roman Wronski, Princeton, N.J.

[73] Assignee: RCA Corporation, New York, N.Y.

[21] Appl. No.: 819,936

[22] Filed: Jul. 28, 1977

[51] Int. Cl.² .............................................. H01L 27/14
[52] U.S. Cl. ........................................ 357/30; 357/23; 357/6
[58] Field of Search ................................ 357/6, 30, 23

[56] References Cited
U.S. PATENT DOCUMENTS

| 3,577,047 | 5/1971 | Cheroff | 317/235 |
|---|---|---|---|
| 3,631,308 | 12/1971 | Krolkowski | 317/235 |
| 3,916,268 | 10/1975 | Engeler | 357/23 |
| 4,064,521 | 12/1977 | Carlson | 357/2 |
| 4,070,206 | 1/1978 | Kressel | 136/89 |

Primary Examiner—Martin H. Edlow
Attorney, Agent, or Firm—H. Christoffersen; Birgit E. Morris; A. Stephen Zavell

[57] ABSTRACT

In a photovoltaic semiconductor device, an electrically insulating layer is between and in contact with a body of amorphous silicon fabricated by a glow discharge in silane and a metallic film of a metal capable of forming a surface barrier junction with the amorphous silicon body. The insulating layer is of such a relatively thin thickness that charge carriers are capable of tunneling through the insulating layer. The insulating layer has been found to increase the open circuit voltage of the photovoltaic device without adversely affecting the short circuit current density of the device.

8 Claims, 2 Drawing Figures

AMORPHOUS SILICON PHOTOVOLTAIC DEVICE HAVING AN INSULATING LAYER

BACKGROUND OF THE INVENTION

The present invention relates to amorphous silicon photovoltaic devices and more particularly to photovoltaic devices having an electrically insulating layer between the amorphous silicon body and a metallic film.

Photovoltaic devices such as solar cells and photodetectors are capable of converting light, i.e., infrared to the ultraviolet range, into usable electrical energy. A problem encountered in the field of photovoltaic devices is that the cost of producing electrical energy from such devices is often not competitive with other means of electricity generation.

It has recently been discovered that inexpensive and efficient photovoltaic devices can be fabricated having very thin bodies of amorphous silicon prepared by a glow discharge in silane, $SiH_4$, as taught in Ser. No. 710,183, "Semiconductor Device Having A Body Of Amorphous Silicon And Method Of Making The Same", filed July 30, 1976 and Ser. No. 710,186, "Schottky Barrier Semiconductor Device And Method Of Making Same," filed July 30, 1976. The use of thin bodies fabricated by a glow discharge in silane has helped in reducing the semiconductor material expense involved in the manufacture of such devices.

While photovoltaic devices fabricated by a glow discharge in silane have proved an efficient means of converting solar radiation into electrical current, any means for improving the output power of these photovoltaic devices is most desirable.

SUMMARY OF THE INVENTION

A photovoltaic semiconductor device includes a body of amorphous silicon fabricated by a glow discharge in silane with an electrically insulating layer on a surface of the body and a metallic layer on a surface of the insulating layer opposite the body. The insulating layer is of a relatively thin thickness such that charge carriers are capable of tunneling through the layer. The present device provides for improvement in the open circuit voltage.

DETAILED DESCRIPTION OF THE INVENTION

Figure 1:
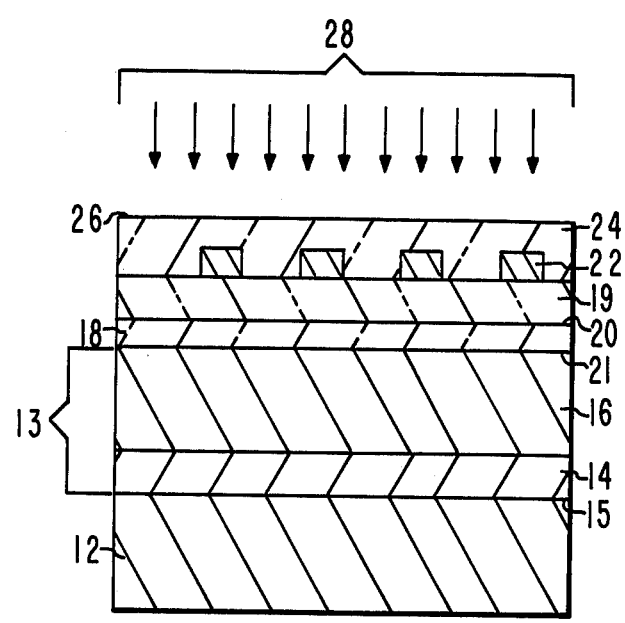
FIG. 1 is a cross-sectional view of the photovoltaic semiconductor device of the present invention.

Referring to FIG. 1 a photovoltaic semiconductor device of the present invention is designated as 10. The photovoltaic semiconductor device 10 is subsequently described as a solar cell for the purpose of explaining the present invention and includes a substrate 12 which has good electrical conductivity properties. Materials having this capability are typically aluminum, chromium, stainless steel, niobium, tantalum, iron and indium-tin oxide on glass, where the indium-tin oxide is the conductive material.

On a surface of the substrate 12 is a body 13 of amorphous silicon fabricated by a glow discharge in silane, $SiH_4$. The method of deposition well known to those skilled in the art as glow discharge involves the discharge of electricity through a gas at a relatively low pressure, i.e., about 5 torr or less, in a partially evacuated chamber. A glow discharge is characterized by several regions of diffuse, luminous glow, i.e., the positive column which is near the anode and the negative glow which is between the anode and the cathode, and a voltage drop in the vicinity of the cathode that is much higher in potential than the ionization potential of the gas, i.e., the Crookes dark space region.

An amorphous material is one which has no long range order in the periodicity of the matrix. Amorphous silicon fabricated by a glow discharge in silane, possesses a short range order of no more than 20 angstroms (Å). The lack of long range order of an amorphous silicon material fabricated by a glow discharge in silane can be detected by X-ray or electron diffraction.

The body 13 may be entirely composed of an amorphous silicon fabricated by a glow discharge in substantially pure silane. However, as is subsequently described, it is preferable that a region of the body 13 in intimate contact with the substrate 12 be doped so as to provide a better ohmic contact with the substrate 12. Thus, it is assumed that the body 13 includes a first layer 14 of amorphous silicon fabricated by a glow discharge in a mixture of silane and a doping gas. The first layer 14 is capable of having an ohmic contact with the substrate 12 and having a first interface 15 therebetween. A second layer 16 of amorphous silicon of the body 13 is on the first layer 14 opposite the substrate 12. The second layer 16 is fabricated by a glow discharge in silane and typically by a glow discharge in substantially pure silane. Since the glow discharge may be in substantially pure silane, it would be anticipated that the second layer 16 is intrinsic; however, it has been discovered that the second layer 16, even when fabricated in pure silane, is slightly N-type, i.e., for deposition on a deposition surface heated to a temperature greater than 100° C. The first and second layers 14 and 16 are of the same conductivity type. Preferably, the dopant concentration of the first layer 14 is graded such that the concentration of the dopant is a maximum at the interface 15 and decreases to an insignificant concentration at the interface of the first layer 14 and second layer 16. While it is preferred that the first layer 14 have a graded dopant concentration, it is also anticipated by the present invention that the dopant concentration may be uniform throughout the first layer 14.

The amorphous silicon of the first and second layers 14 and 16 is formed by a glow discharge in silane plus an appropriate doping gas for first layer 14, and can be distinguished from other amorphous silicon in that it has the characteristics of an average density of localized states in the energy gap on the order of $10^{17}/cm^3$ or less. The average density of localized states is determined by plotting the ratio of 1 over the capacitance squares $(1/C^2)$ as a function of voltage for the amorphous silicon semiconductor device. For amorphous silicon fabricated by a glow discharge in silane the drift mobility for electrons is $10^{-3} cm^2/V$-sec. or greater. The drift mobility for electrons is measured by the well known technique of impinging light pulses or electron beam pulses on the biased semiconductor device and the subsequent flow of the electrons generated by the pulses is followed by a sampling system.

The first layer 14 is typically in the range of 100 angstroms to about 0.5 micron in thickness, and the second layer 16 is about 0.3 to 1 micron in thickness. On a surface of the second layer 16 opposite the first layer 14 is a layer 18 of an electrically insulating material. An interface 21 is between the second layer 16 and insulating layer 18. The insulating layer 18 is relatively thin in thickness so that charge carriers are capable of tunneling through. Preferably, the insulating layer is about 20 angstroms in thickness, however, it can be of a thickness in the range of about 10 to 50 angstroms. The insulating layer 18 is typically of an oxide or a nitride such as silicon dioxide or silicon nitride.

On a surface of the electrically insulating layer 18 opposite the body 13 is a metallic film 19, with an interface 20 therebetween. The metallic film 19 is at least semitransparent to solar radiation and is of a metallic material with good electrical conductivity and of a high work function, i.e., greater than 4.5eV, assuming the second layer 16 is of N-type conductivity. Metallic materials having the characteristics of good electrical conductivity and high work function are for example, platinum, palladium, rhodium, iridium or chromium. Since the metallic film 19 is at least semitransparent to solar radiation and is a metal, it should be on the order of about 50 to 100 angstroms thick to assure transparency.

Typically, the first layer 14 is of N type conductivity, although the present invention anticipates that the first layer 14 could also be of P type conductivity, in which case, the second layer 16 would be slightly P type. If the second layer 16 is slightly P type then the metallic film 19 would be of a low work function metal, less than about 4.3eV, e.g., aluminum.

On a portion of the surface of the metallic film 19 opposite the interface 20 is an electrode 22. Typically, the electrode 22 is of a metal having good electrical conductivity and is in the shape of a grid, although it can be of other shapes well known to those in the art, e.g., finger or comb shaped.

An antireflection layer 24 is on the electrode 22 and on the surface of the metallic film 19 opposite the interface 20 not occupied by the electrode 22. The antireflection layer 24 has an incident surface 26 on which solar radiation 28 is capable of impinging. As is well known in the art, there is an increase in the quantity of solar radiation 28 traversing the metallic film 19 and entering the body 13 by having the antireflection layer 24. The antireflection layer 24 is typically of a thickness on the order of $\lambda/n$, wherein "$\lambda$" is the wavelength of the radiation impinging incident surface 26 and "$n$" is the index of refraction of the antireflection layer 24. The index of refraction, "$n$" of the antireflection layer 24, should be of an appropriate value to increase the amount of solar radiation 28 impinging the metallic film 19. For example, if the metallic film 19 is platinum, 50 angstroms in thickness, a suitable antireflection layer 24 would be of $ZrO_2$, about 450 angstroms in thickness with "$n$" equal to 2.1. Usually, the antireflection layer 24 will be of a dielectric material such as zinc sulfide, zirconium oxide or silicon dioxide, but can be a transparent semiconductor material such as tin oxide doped with antimony, or indium oxide doped with tin.

It is well known in the field of semiconductors that a surface barrier junction is formed as a result of the contacting of certain metals to certain semiconductor materials. In the photovoltaic device 10 of the present invention, even though the metallic film 19 is not in direct contact with the amorphous silicon body 13, a surface barrier junction is nevertheless formed at the interface 21. A surface barrier junction generates a space charge or electric field in the amorphous silicon body 13 from the interface 21 which penetrates into the second layer 16 and is referred to as the depletion region. Furthermore, as a result of the graded dopant concentration of the first layer 14 an electric field is created in the first layer 14. Thus, an electric field will essentially extend through both the first and second layers 14 and 16. It is preferable that the electric field extends through both the first and second layer since carriers created anywhere within these layers, as a result of the absorption of solar radiation 28, are swept by the electric field to either the substrate 12 or the metallic region 19. The substrate 12 functions as one of the electrodes of the photovoltaic device 10. If the electric field does not extend into a portion of the first or second layers 14 and 16 of the device 10, any carriers generated in this quasi-neutral region would not be swept to an electrode by means of a field and must rely on diffusion to the depleted region in order to be collected as current.

The graded dopant concentration of the first layer 14 is advantageous in lengthening the electric field region of the device 10 and in addition allows an ohmic contact to be more readily formed between the first layer 14 and substrate 12. This improvement in contacting assures that the dopant concentration of the first layer 14 is maximized at the first interface 15, e.g., on the order of 5 atomic percent of phosphorus. The forming of an ohmic contact at interface 15 is advantageous in assuring a low series resistance for the photovoltaic device 10. However, even if the layer 14 has a uniform dopant concentration throughout, an ohmic contact can be formed at interface 15 as long as the uniform doping concentration is typically on the order of about 5 atomic percent.

It has been found that the photovoltaic device 10 of the present invention produces a larger open circuit voltage than Schottky barrier type photovoltaic devices, as taught in copending application Ser. No. 710,186. The essential difference between the device of copending application Ser. No. 710,186 and the photovoltaic device 10 of the present invention is the electrically insulating layer 18 which is between metallic film 19 and the amorphous silicon body 13. Generally, the values of the open circuit voltage of the present invention are 100 to 200 mV higher, when the insulating layer 18 is of an oxide, than those open circuit voltage values generated by prior art amorphous silicon Schottky barrier photovoltaic devices. It is believed that by having an insulating layer 18 of appropriate thickness, i.e., 10 to 50 angstroms, the flow of majority carriers through the second layer 16 is reduced. This reduction in majority carrier flow accompanied by the ability of the photogenerated minority carriers to tunnel through the insulating layer 18, results in the increase in open circuit voltage.

It is also been found that the photovoltaic device 10 of the present invention exhibits a larger value of diode quality factor in the dark than amorphous silicon Schottky barrier devices not having an insulating layer 18. For example, the photovoltaic device 10 has been found to have a diode quality factor in the dark of approximately 1.5 versus 1.0 to 1.1 for a prior art amorphous silicon Schottky barrier photovoltaic device not having the insulating layer 18 of the present invention.

The short circuit density of the photovoltaic device 10 is not affected in any detrimental manner by the insulating layer 18 as long as the insulating layer 18 is of relatively thin thickness as previously described.

Figure 2:
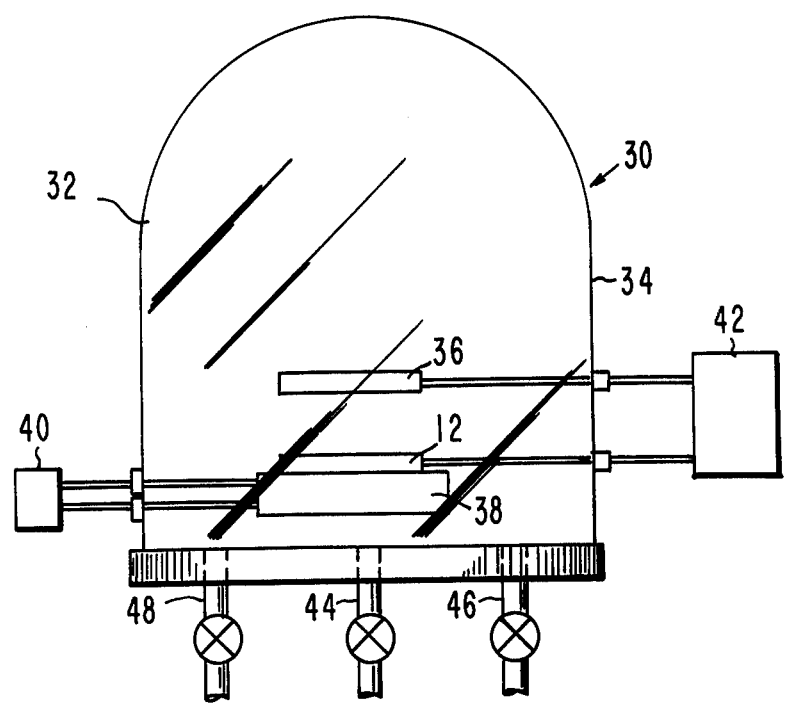
FIG. 2 is a schematic view of an apparatus for carrying out the fabrication of amorphous silicon by a glow discharge in silane.

Referring to FIG. 2, a glow discharge apparatus suitable for carrying out the fabrication of the semiconductor device 10 of the present invention is generally designated as 30. The glow discharge apparatus 30 includes a chamber 32 defined by a vacuum bell 34, typically of a glass material. In the vacuum chamber 32 is an electrode 36, and a heating plate 38 spaced from and opposite the electrode 36. The electrode 36 is of a metallic material having good electrical conductivity such as platinum and is in the form of a screen or coil. The heating plate 38 is a ceramic frame with enclosed heating coils which are energized from a current source 40, external to the vacuum chamber 32.

A first outlet 44 into the vacuum chamber is connected to a diffusion pump, a second outlet 46 is connected to a mechanical pump, and a third outlet 48 is connected to a gas bleed in system which is the source of the various gases utilized in the glow discharge process. While the second outlet 46 is described as being connected to a diffusion pump it is anticipated that a diffusion pump may not be necessary since the mechanical pump connected to the first outlet 44 may evacuate the system to a sufficient pressure.

In the fabrication of the semiconductor device 10, the substrate 12, e.g., stainless steel, is placed on a heating plate 38 and is connected to one terminal of a power source 42 and the electrode 36 is connected to an opposite terminal of power source 42. A voltage potential therefore exists between the electrode 36 and substrate 12. The power source 42 can be either DC or it can be AC, i.e., the low frequency range for example 60 hertz, or it can be RF, i.e., in the high frequency range, for example on the order of megahertz. Typically, when the power source 42 is DC the electrode 36 is connected to the positive terminal of the power source 42 and the substrate is connected to the negative terminal of the power source 42. Thus, the electrode 36 functions as an anode and the substrate 12 functions as a cathode when the power source 42 is energized. This is referred to as a cathodic DC operation. However, in DC operation, the substrate 12 and electrode 36 can be of the opposite electrical polarities described, i.e., the substrate 12 is the anode and the electrode 36 is the cathode, which is referred to as an anodic DC operation. Furthermore, RF glow discharge operation can be accomplished in an electroless glow discharge apparatus of a type well known to those skilled in the art, e.g., capacitive RF glow discharge system or an inductive glow discharge system.

The vacuum chamber 32 is evacuated, typically to a pressure to about $10^{-3}$ to $10^{-6}$ torr, and the substrate 12 is heated to a temperature in the range of 150°–450° C. by energizing the heating coils of the heating plate 38. Then, an atmosphere of about 98.5% silane and about 1.5% N-type dopant gas is bled into the vacuum chamber 32 to a pressure of 0.1 to 5.0 torr; the resultant pressure raises the substrate temperature to a value in the range of 200° C.–500° C. Typically, N-type dopant gases which may be utilized in a glow discharge process are phosphine, $PH_3$, and arsine, $AsH_3$. Also, materials such as antimony, Sb, bismuth, Bi, sodium hydride, NaH, and cesium nitride, $CsN_3$, can be used by placing them in an evaporation boat and heating them in the atmosphere of the vacuum chamber 32 until the desired amount of dopant gas or vapor is released into the silane atmosphere.

To initiate the glow discharge between the electrode 36 and the substrate 12, the power source 42 is energized, thereby commencing the deposition of the doped amorphous silicon layer 14. The DC cathodic mode of operation is assumed. For deposition of the first layer 14, the current density should be in the range of 0.1 to 3.0 ma/cm² at the surface of the substrate 12. The deposition rate of amorphous silicon increases with the silane pressure and the current density. For pressure of 2 torr and current density of 1 ma/cm² to a cathodic substrate 12 at 350° C., the deposition of approximately 200 angstroms of doped amorphous silicon occurs in a few seconds. To grade the dopant concentration of the first layer 14 additional silane is bled into the vacuum chamber 32 during the glow discharge deposition. Once the glow discharge is initiated for the DC cathodic mode, electrons from the substrate 12 are emitted from the substrate to strike silane molecules, $SiH_4$, both ionizing and dissocating the molecules. The positive silicon ions and the positive silicon hydride ions such as $SiH^+$, are attracted to the substrate 12, which is the cathode and silicon containing some hydrogen is thereby deposited on the substrate 12. It is believed that the presence of hydrogen in the amorphous silicon is beneficial to its electronic properties.

Once the first layer 14 has been formed, the atmosphere in the vacuum chamber 32 is pumped out by the mechanical pump 46.

With the vacuum chamber 32 to a pressure of about $10^{-6}$ torr, substantially pure silane is bled into the vacuum chamber 32 to a pressure in the range of 0.1 to 5 torr. Again a glow discharge is initiated for 1 to 5 minutes with a current density of about 0.3 milliamps/cm² to 3.0 milliamps/cm² at the first layer 14 for the deposition of the second layer 16. It has been found that the second layer 16 of amorphous silicon fabricated by a glow discharge in substantially pure silane is of a slightly N-type conductivity, when deposited on a first layer 14 which is at a temperature of about 100° C. or greater.

The temperature of the substrate 12 in the glow discharge process may influence the composition and structure of the material deposited thereon due to the effects of auto doping, eutectic formation and induced crystallization, e.g., deposition on a single crystalline silicon substrate at temperatures above about 500° C. result in the deposition of a polycrystalline silicon, and deposition on a gold substrate at a temperature above 186° C. result in induced crystallization of the deposited silicon.

The body 13 has been formed with the deposition of the second layer 16. The forming of the electrically insulating layer 18 may be performed by several alternative methods. An insulating layer 18 of an oxide may be formed by the heating of the body 13 in an air or oxygen atmosphere for approximately ½ hour at temperatures in the range of 200°–350° C. An oxide insulating layer 18 could also be formed at the same time that the metallic film 19 is formed by evaporating the metal of the metallic film 19 onto the body 13 in a partial atmosphere of oxygen at a pressure of approximately $8 \times 10^{-5}$ torr. An insulating layer 18 of silicon nitride could be formed by a glow discharge process in an atmosphere of silane, $SiH_4$, and nitrogen, $N_2$. Glow discharge deposition could also be used to deposit an insulating layer 18 of materials such as silicon dioxide, $SiO_2$, or boron nitride, BN. It is also anticipated by the present invention that the insulating layer 18 of an oxide or nitride could be deposited by the well known techniques of evaporation, sputtering or chemical vapor deposition.

Once the insulating layer 18 is formed, assuming it is not formed simultaneous with the metallic layer 19, the body 13 and insulating layer 18 are placed in a state of the art evaporation system and a metallic film 19 is evaporated onto the insulating layer 18. Likewise, the electrode 22 and antireflection layer 24 are deposited on the metallic film 19 by state of the art evaporation and masking techniques. The entire processing could be accomplished in a single system accommodating both glow discharge and evaporation.

As described above, the insulating layer 18 of the photovoltaic device 10 of the present invention is believed to be responsible for the larger open circuit voltages exhibited by the present invention as compared to prior art amorphous silicon Schottky barrier photovoltaic devices.

We claim:

1. A photovoltaic semiconductor device comprising:
  a body of amorphous silicon fabricated by a glow discharge in silane, $SiH_4$;
  a layer of an electrically insulating material on a surface of said body, said insulating layer being of a thickness such that charge carriers are capable of tunneling through said layer; and
  a metallic layer on a surface of said insulating layer opposite said body.

2. The photovoltaic semiconductor device in accordance with claim 1 wherein said insulating layer is an oxide.

3. The photovoltaic semiconductor device in accordance with claim 1 wherein said insulating layer is a nitride.

4. The photovoltaic semiconductor device in accordance with claim 1 wherein the insulating layer is of a thickness in the range of 10 to 50 angstroms.

5. The photovoltaic semiconductor device in accordance with claim 1 wherein the insulating layer is about 20 angstroms in thickness.

6. The photovoltaic semiconductor device in accordance with claim 1 wherein said body comprises a first layer of doped amorphous silicon fabricated by a glow discharge in a mixture of silane and a doping gas and a second layer of amorphous silicon fabricated by a glow discharge in silane contiguous to said first layer, said second layer being contiguous to said insulating layer opposite said first layer.

7. The photovoltaic semiconductor device in accordance with claim 1 wherein said entire body comprises an amorphous silicon fabricated by a glow discharge in substantially pure silane.

8. A photovoltaic semiconductor device comprising:
  an eletrically conductive substrate;
  a body of amorphous silicon fabricated by a glow discharge in silane, $SiH_4$, being on said substrate;
  a layer of an electrically insulating material on a surface of said body opposite said substrate, said insulating layer being of a thickness such that charge carriers are capable of tunnelling through said insulating layer;
  a metallic layer on a surface of said insulating layer opposite said body;
  an electrode on portions of the surface of the metallic film opposite said insulating layer; and
  an antireflection layer on said electrode and on the portion of the surface of said metallic film not occupied by said electrode.

* * * * *